United States Patent [19]

Clark

[11] 4,030,045

[45] June 14, 1977

[54] DIGITAL DOUBLE DIFFERENTIAL PHASE-LOCKED LOOP

[75] Inventor: James Monroe Clark, Cedar Grove, N.J.

[73] Assignee: International Telephone and Telegraph Corporation, Nutley, N.J.

[22] Filed: July 6, 1976

[21] Appl. No.: 702,803

[52] U.S. Cl. .................. 331/1 A; 331/23; 331/25; 329/122
[51] Int. Cl.² .......................... H03B 3/04
[58] Field of Search ........... 331/1 A, 18, 23, 25; 329/122, 124, 125

[56] References Cited

UNITED STATES PATENTS

| | | | |
|---|---|---|---|
| 3,164,777 | 1/1965 | Guanella | 331/18 X |
| 3,413,565 | 11/1968 | Babany et al. | 331/18 |
| 3,769,602 | 10/1973 | Griswold | 329/122 |

Primary Examiner—Siegfried H. Grimm
Attorney, Agent, or Firm—John T. O'Halloran; Alfred C. Hill

[57] ABSTRACT

A first generator provides a reference pulse train having a predetermined reference frequency. A second generator including a voltage controlled oscillator provides a bit clock having a repetition frequency locked to the repetition frequency of the bits of digital data. A first divider coupled to the first generator divides the reference frequency by a selected one of a first division factor and a second division factor different than the first division factor. A fourth divider coupled to the second generator divides the repetition frequency of the bit clock by a selected one of a third division factor and a fourth division factor different than the first, second and third division factors. A phase comparator coupled to the first and second dividers compare the phase of the output signals of the first and second dividers and produces a control signal proportional to the phase difference between the output signals of the first and second dividers. The control signal is coupled through a loop filter to the voltage controlled oscillator to lock the phase of the bit clock to the bits of the digital data. Logic circuitry coupled to the digital data source, the second generator and the first and second dividers produce a phase slip rate signal to select the appropriate one of the first and second division factors for the first divider and to select the appropriate one of the third and fourth division factors for the second divider.

30 Claims, 20 Drawing Figures

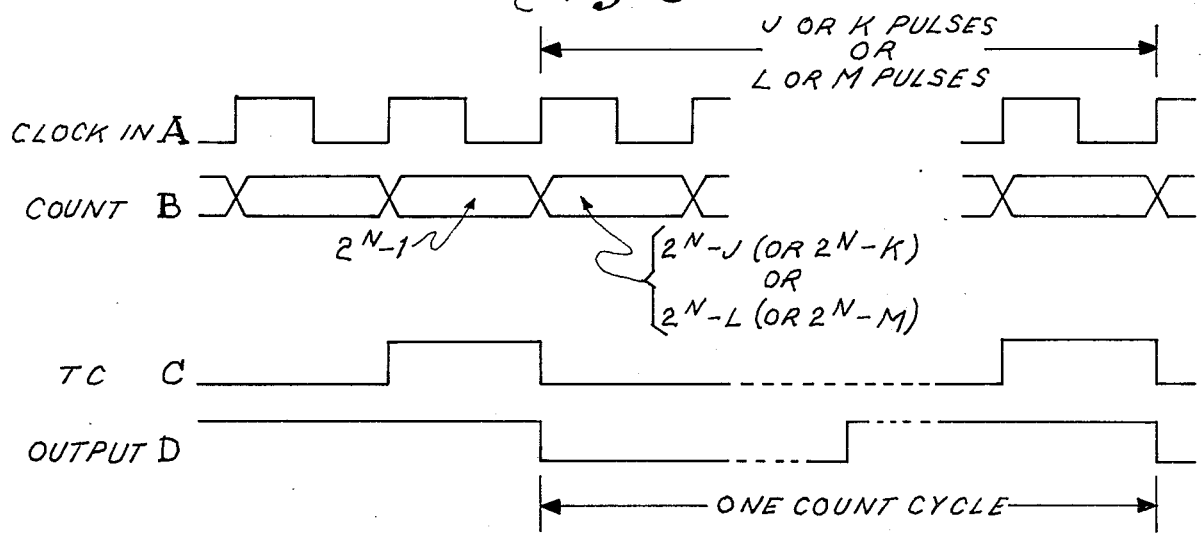
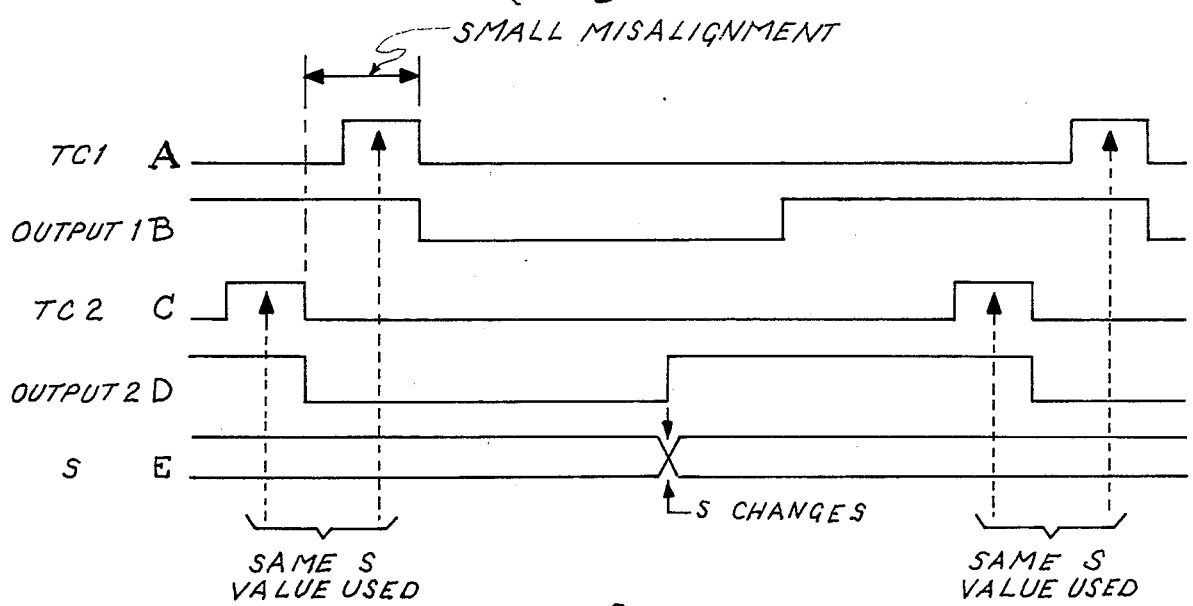
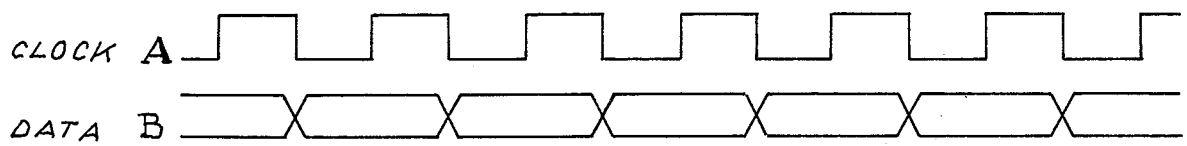
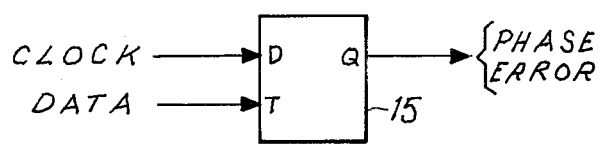

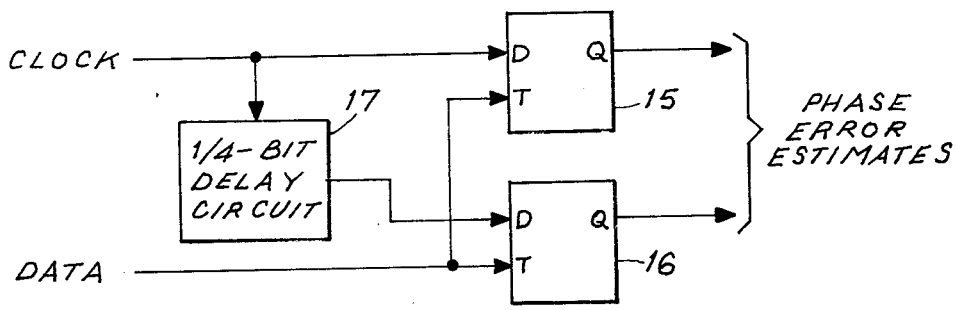
Fig. 10
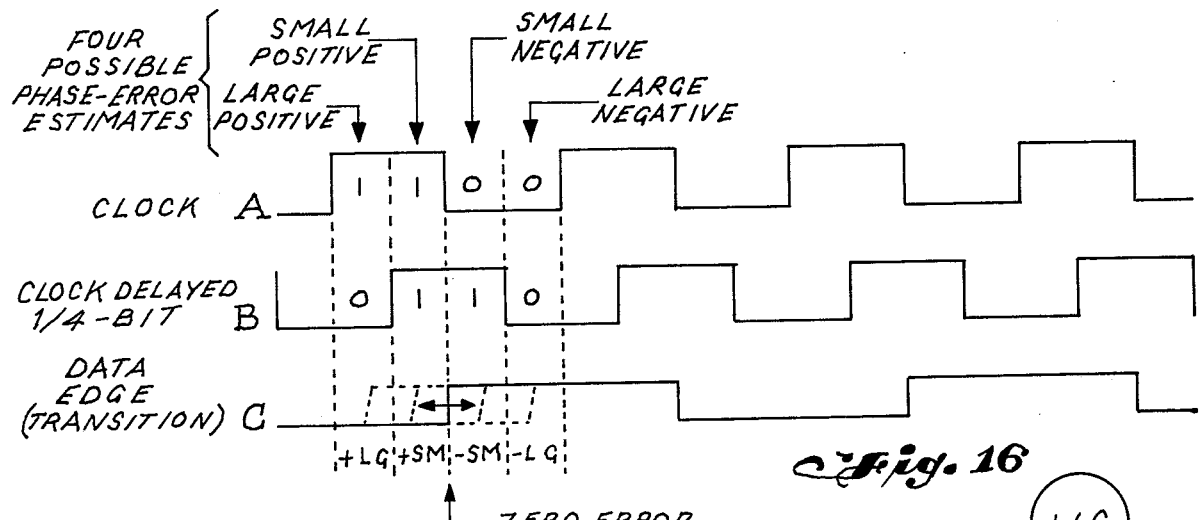
Fig. 11
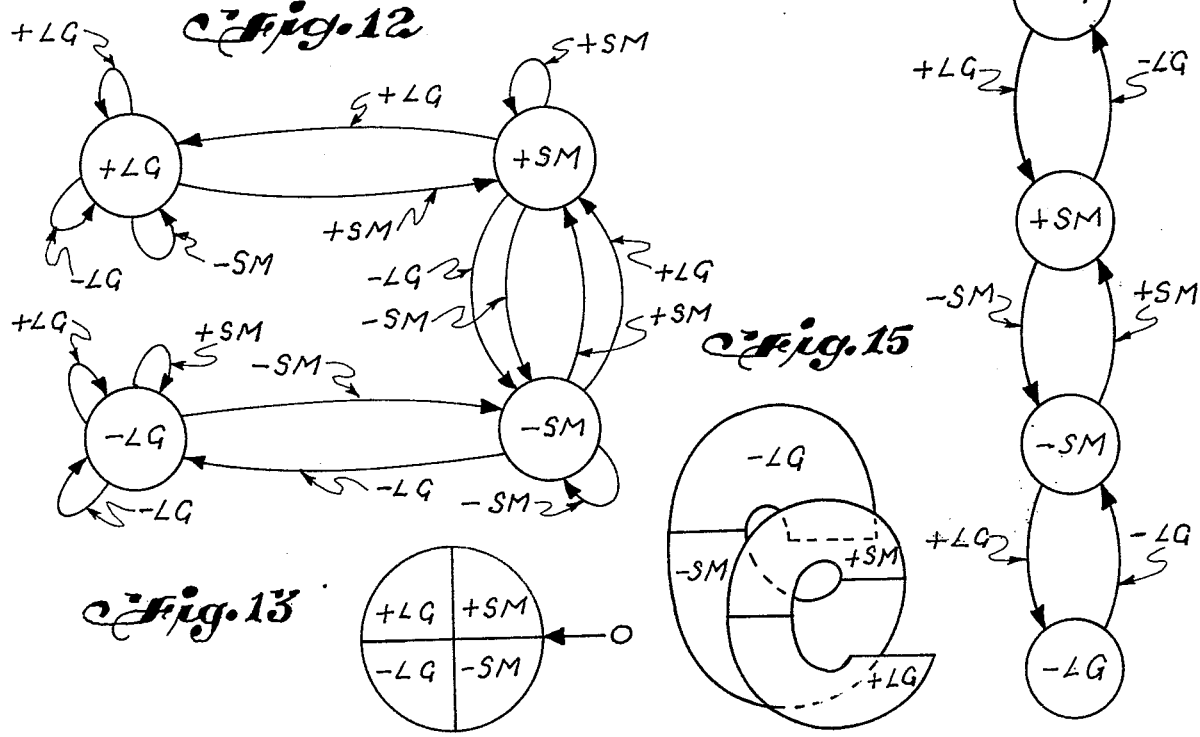
Fig. 12
Fig. 13
Fig. 15
Fig. 16

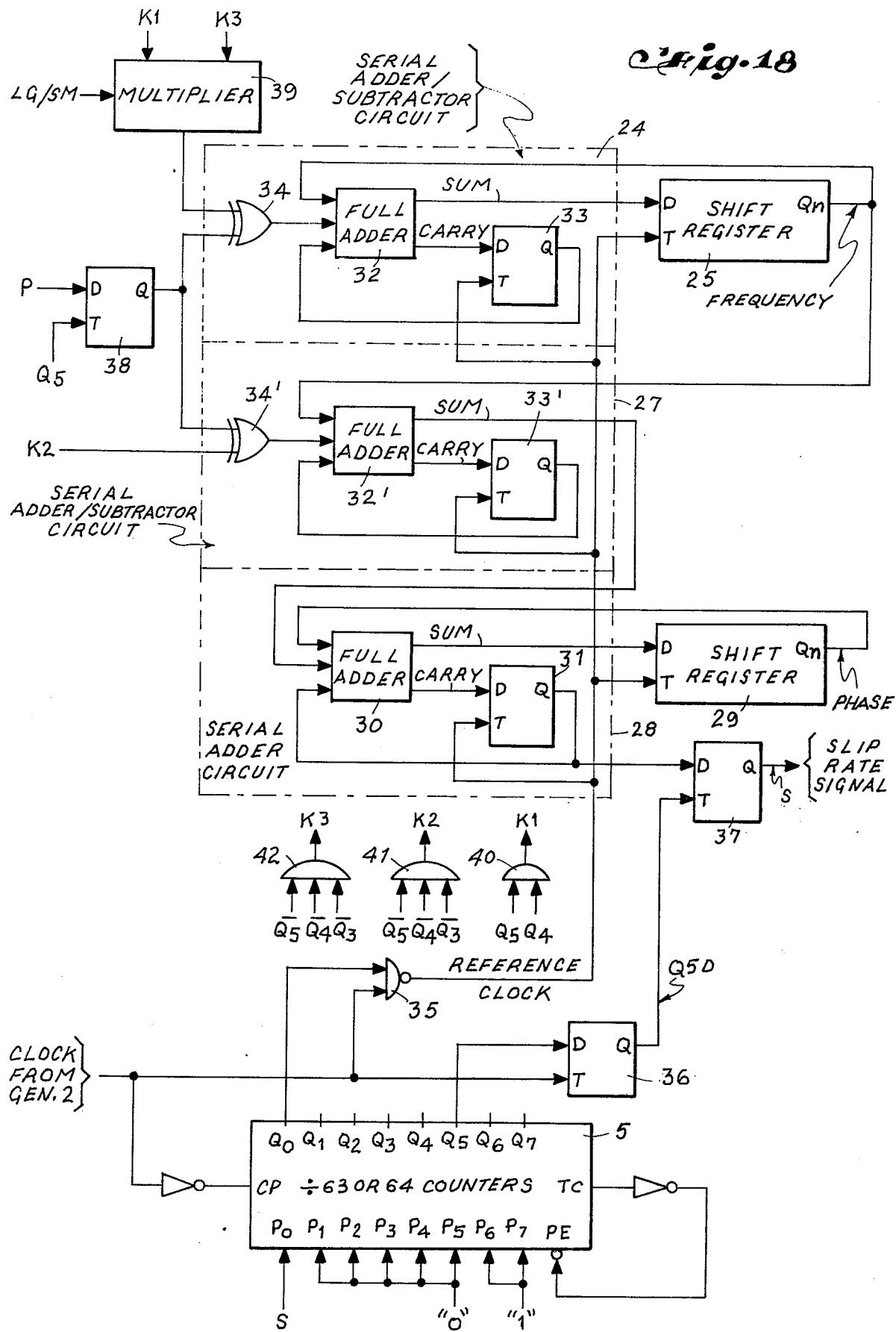

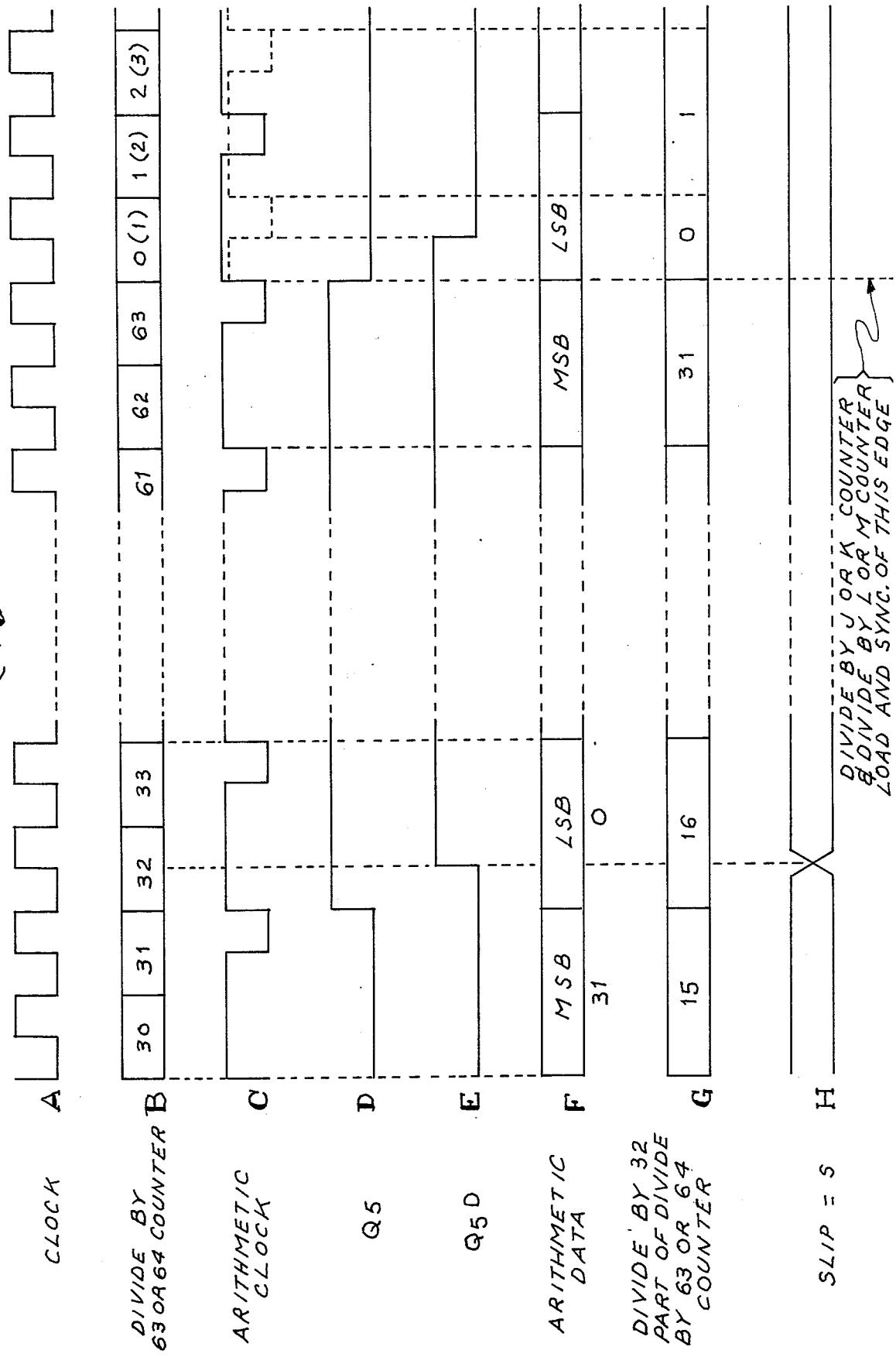

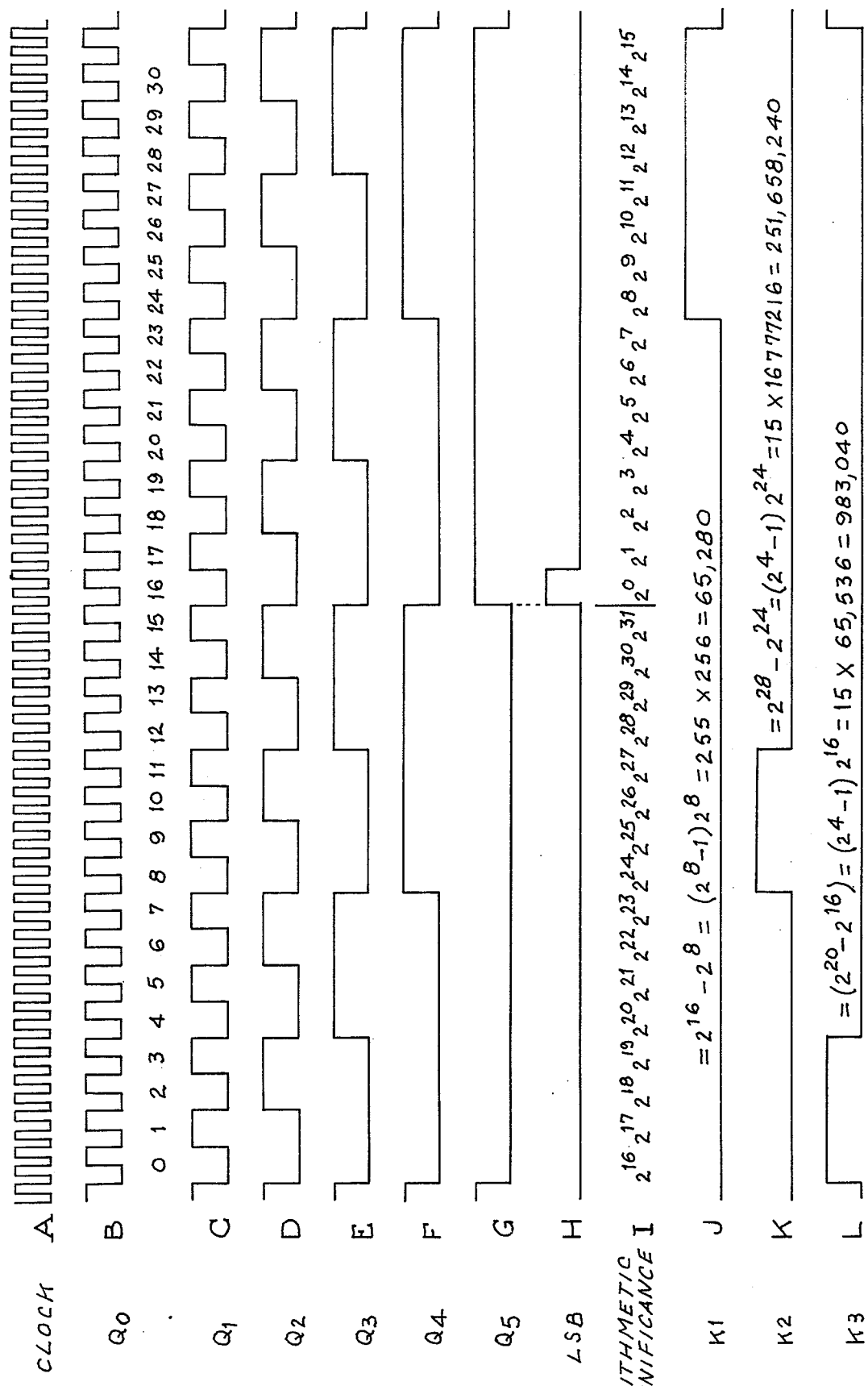

DIGITAL DOUBLE DIFFERENTIAL PHASE-LOCKED LOOP

BACKGROUND OF THE INVENTION

This invention relates to digital data communications systems and more particularly to phase-locked loops (PLLs) for extraction of a bit clock from digital data.

Digital techniques are commonly used for low-cost, low-quality PLLs. Digital techniques are also attractive for high-quality PLLs because these techniques permit precise, no-drift, no-offset, no-adjustment operation except for the reference signal generator. It has been considered difficult, however, to employ digital techniques for PLLs operating at frequencies close to or exceeding the maximum speeds of the logic circuitry. The source of this difficulty is that digital PLLs typically employ a reference signal generator and a divide-by-N counter controlled by a phase slip rate control signal. The phase of the counter is made to slip by one cycle of the reference frequency in order to move the phase of the output frequency by 1/N cycle. The phase slip rate control signal controls the output frequency and the output signal is approximately smooth or phase-continuous to the degree that N is large. This forces the maximum logic speed to be N times the output rate.

One alternative is to use a digitally-controlled low frequency with a high reference frequency. But the large difference between these frequencies leads to relatively close sum and difference frequencies from the mixer, requiring a high-quality filter to separate them, a major economic setback.

It might appear that a simple slave PLL multiplying the digitally-controlled low frequency up to the required output frequency might offer a solution. But any frequency multiplier will also multiply the size of the phase slips measured in degrees or cycles.

SUMMARY OF THE INVENTION

An object of the present invention is to provide a PLL that will overcome the disadvantages mentioned hereinabove.

Another object of the present invention is to produce phase slips smaller than the logic can produce directly.

Still another object of the present invention is to provide a PLL that provides phase slips less than one nanosecond, for example, using 50 MHz (megahertz) logic.

A feature of the present invention is to provide a digital double differential PLL for extraction of a bit clock from digital data comprising: a source of digital data; first means to provide a reference pulse train having a predetermined reference frequency; second means including a voltage controlled oscillator to provide the bit clock having a repetition frequency locked to the repetition frequency of the bits of the digital data; third means coupled to the first means to divide the reference frequency by a selected one of a first division factor and a second division factor different than the first division factor; fourth means coupled to the second means to divide the repetition frequency by a selected one of a third division factor and a fourth division factor different than the first, second and third division factors; fifth means coupled to the third and fourth means to compare the phase of the output signals of the third and fourth means and to produce a first control signal proportional to the phase difference between the output signals of the third and fourth means; sixth means coupled to the fifth means and the second means to couple the first control signal to the voltage controlled oscillator to adjust the phase of the bit clock to lock the bit clock to the bits of the digital data; and seventh means coupled to the source, the second means and the third and fourth means to produce a phase slip rate signal to select the appropriate one of the first and second division factors for the third means and to select the appropriate one of the third and fourth division factors for the fourth means.

BRIEF DESCRIPTION OF THE DRAWING

Above-mentioned and other features and objects of this invention will become more apparent by reference to the following description taken in conjunction with the accompanying drawing, in which:

FIGS. 6 and 7 are timing diagrams useful in explaining the operation of the counters of FIG. 3;

FIG. 8 is a timing diagram illustrating the operation of the phase comparator of FIG. 3 coupled to the data input;

FIG. 9 is a block diagram of one embodiment of the phase comparator of FIG. 3 coupled to the data input;

FIG. 10 is another embodiment of the phase comparator of FIG. 3 coupled to the data input;

FIG. 11 is a timing diagram illustrating the operation of the phase comparator of FIG. 10 and the phase comparator of FIG. 14;

FIG. 12 is the state transition diagram illustrating what is shown in TABLE I;

FIG. 13 illustrates the phases of the phase/frequency comparator of FIG. 14;

FIG. 15 illustrates the states as shown in TABLE II

FIG. 16 is a state transition diagram illustrating what is shown in TABLE II;

FIG. 18 is a block diagram illustrating in greater detail the digital loop filter and digitally controlled rate generator of FIG. 17;

FIG. 19 is a timing diagram illustrating the operation of FIG. 18; and

FIG. 20 is a timing diagram illustrating the generation of the K1, K2 and K3 correction factors of FIG. 18.

DESCRIPTION OF THE PREFERRED EMBODIMENT

Figure 1:
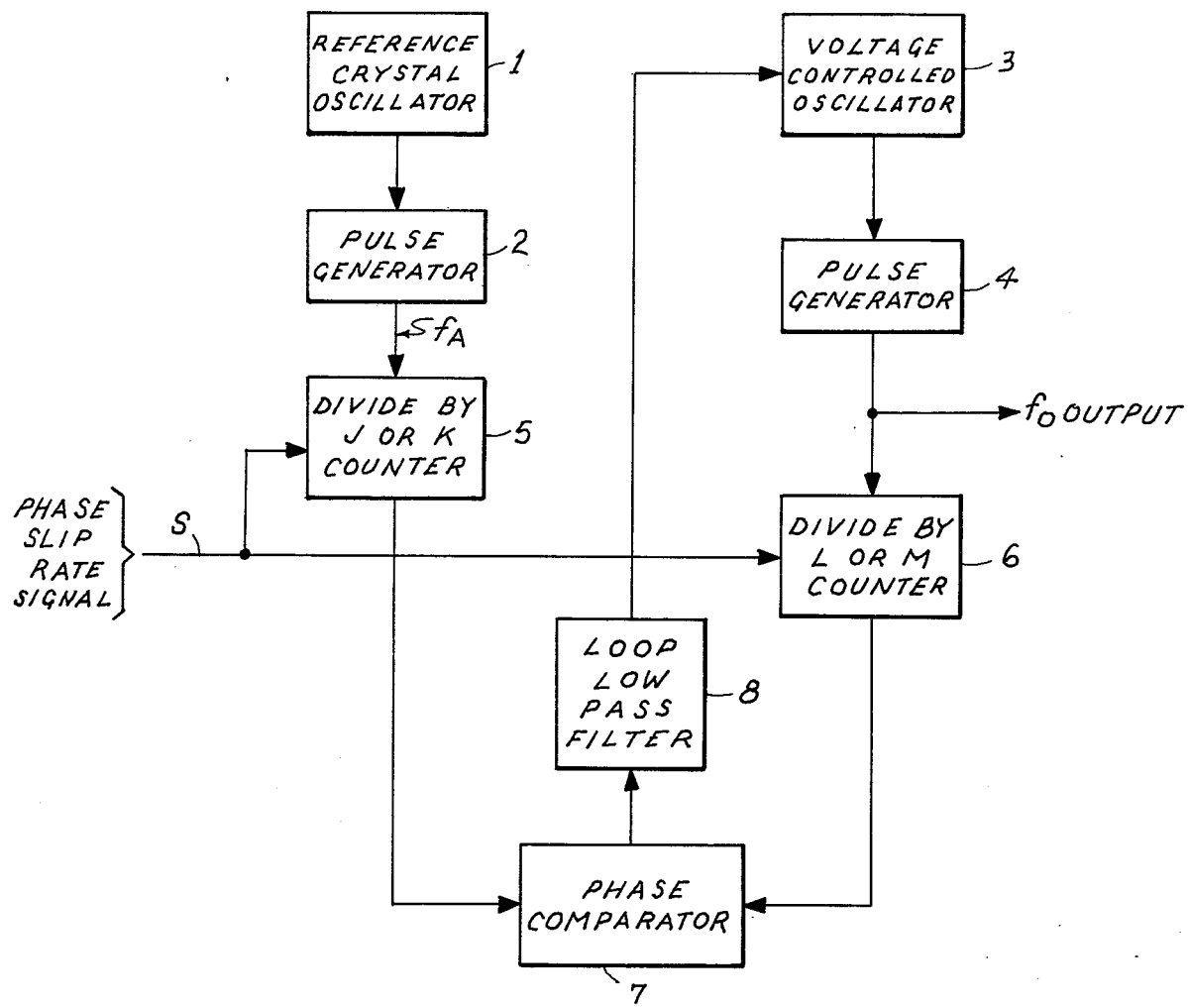
FIG. 1 is a block diagram of the basic digital PLL in accordance with the principles of the present invention.

Referring to FIG. 1, the PLL arrangement shown combines the low-frequency slip rate S with the high reference frequency $f_R$, generated by reference crystal oscillator 1 and pulse generator 2, to produce the output rate $f_0$, generated by the voltage controlled oscillator 3 and pulse generator 4. The output frequency $f_0$ is varied by varying the slip rate S. The reference frequency is divided by a J or K counter 5 and the output frequency $f_0$ is divided by an L or M counter 6. The output of counters 5 and 6 have their phase compared in phase comparator 7 which may be in the form of an EXCLUSIVE OR gate or the comparator of FIG. 9 described hereinbelow. The phase error signal from comparator 7 is coupled through a loop low pass filter 8 to voltage controlled oscillator 3 to appropriately lock the output frequency $f_0$.

A requirement for the division integers J, K, L and M is that the difference JM − KL is small, typically equal to 1.

When there is no phase slipping, counters 5 and 6 divide by J and L, respectively, so that $f_o = (L/J) f_R$. During a phase slip, counters 5 and 6 divide by K and M, respectively, so that $f_o' = (M/K) f_R$. For example, J = 63, K = 64, L = 503, M = 511 and $f_o'/f_o = 1.000031$, that is, a 31 ppm (pulse per minute) shift. For each phase slip, counter 5 slips K−J cycles of the reference frequency and counter 6 slips M−L cycles of the output frequency, but the net shift seen at the output is only 1/J cycle of the output frequency, provided JM−KL = 1, because the counter shifts nearly cancel at phase comparator 7. It can be shown that $(K−J)/f_R − (M−L)f_o = d/Jf_o$, where $d = JM−KL$.

For example, using the previous example integers and $f_o = 37.44$ MHz, the output phase shift is only 0.4 nanoseconds. Thus, for a slip rate S, the output frequency is shifted by S/J (faster).

To insure that both counters 5 and 6 slip nearly simultaneously, the slip rate control S is synchronized to one of the counters. For example, counter 5 may count from 0 through 63 for the divide-by-64 mode, and 1 through 63 for the divide-by-63 mode. Also, counter 6 may count from 1 through 511 for the divide-by-511 mode, and 9 through 511 for the divide-by-503 mode.

Figure 2:
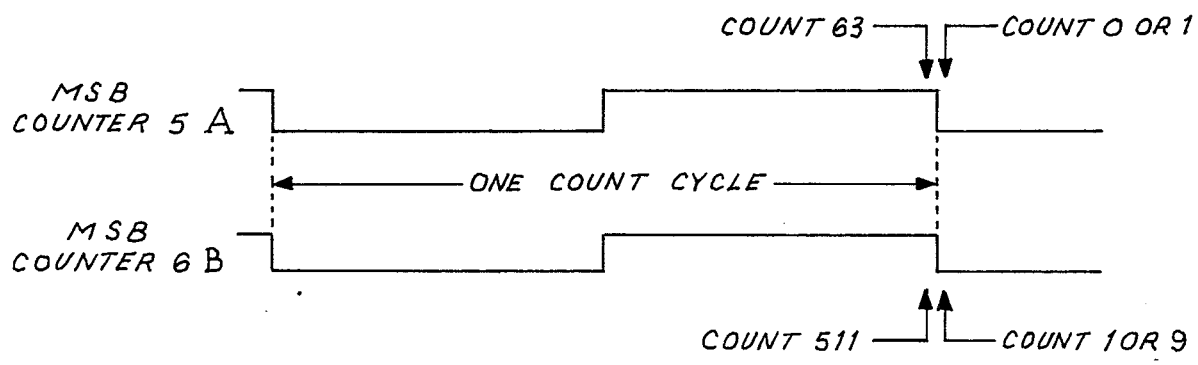
FIG. 2 is a timing diagram illustrating the operation of FIG. 1.

Phase comparator 7 responds to the falling edges of the most significant bit (MSB) of counters 5 and 6, controlling the loop to align these edges as illustrated in FIG. 2. It is at these falling edges that each counter loads the first count of the next cycle, determining the divide ratio. By clocking the slip rate logic on the rising edge of one of the MSB's, both counters 5 and 6 will observe the same slip control state when it is time to determine the first count of the next cycle, even when counters 5 and 6 are misaligned in phase, thus either slipping together or not slipping together.

Figure 3:
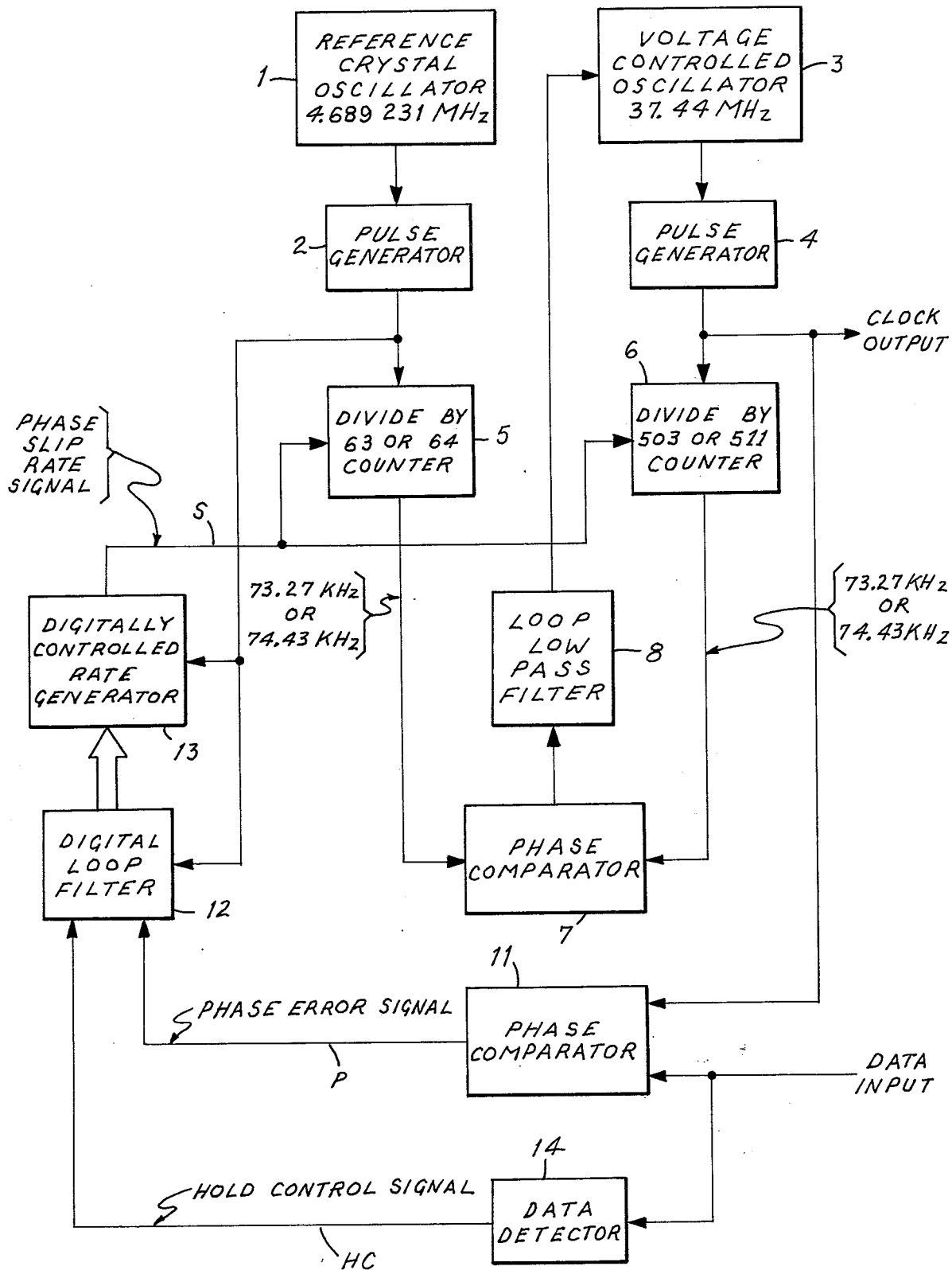
FIG. 3 is a block diagram of a digital double differential PLL employing the PLL of FIG. 1 for extraction of a bit clock from digital data in accordance with the principles of the present invention.

Referring to FIG. 3 there is illustrated a typical application of the PLL of FIG. 1. The PLL of FIG. 3 is a digital double loop arrangement referred to herein as a digital double differential PLL and is employed for extraction of a bit clock for digital data. The secondary loop is the loop discussed with respect to FIG. 1, while the primary loop contains phase comparator 11 coupled to the clock output and to the data input. The phase error signal P detected is coupled to digital loop filter 12 whose output digitally controls a digitally controlled rate generator 13 to provide the phase slip rate signal S to control the division factor of counters 5 and 6 in the secondary loop. Generator 13 produces a slip rate S proportional to the numerical output (frequency value) of the digital filter 12 and proportional to the frequency of the reference clock from generator 2.

Data detector 14 coupled to the data input provides a hold control signal HC which is coupled to filter 12 to cause filter 12 to hold its present frequency value when a loss of data is detected by detector 14. Detector 14 may be in the form of a retriggerable monostable multivibrator capable of providing an output pulse having a given width determined by a time constant. The monostable multivibrator is retriggered by every bit of the data input to start a new output pulse. The monostable multivibrator will complete an output pulse and time out after a selected number of data bits are missing. Thus, detector 14 will provide a 1 output while it is being triggered by the data bits and will produce a 0 when it times out after a certain number of data bits are missing.

Counter 5 can be constructed as follows. First, select $2^N$ greater than or equal to J and greater than or equal to K, where N is an integer. N will be the number of bits in the counter, therefore, N is generally chosen as small as possible. However, when 4-bit medium-scale integrated counter circuits are used, it is convenient to choose a multiple of four for N. Counter 5 is made by modifying a conventional N-bit binary counter having a parallel-load capability. Such a counter, of any length, can be assembled from 4-bit binary counters, such as the Fairchild integrated circuit model 9316.

Figure 4:
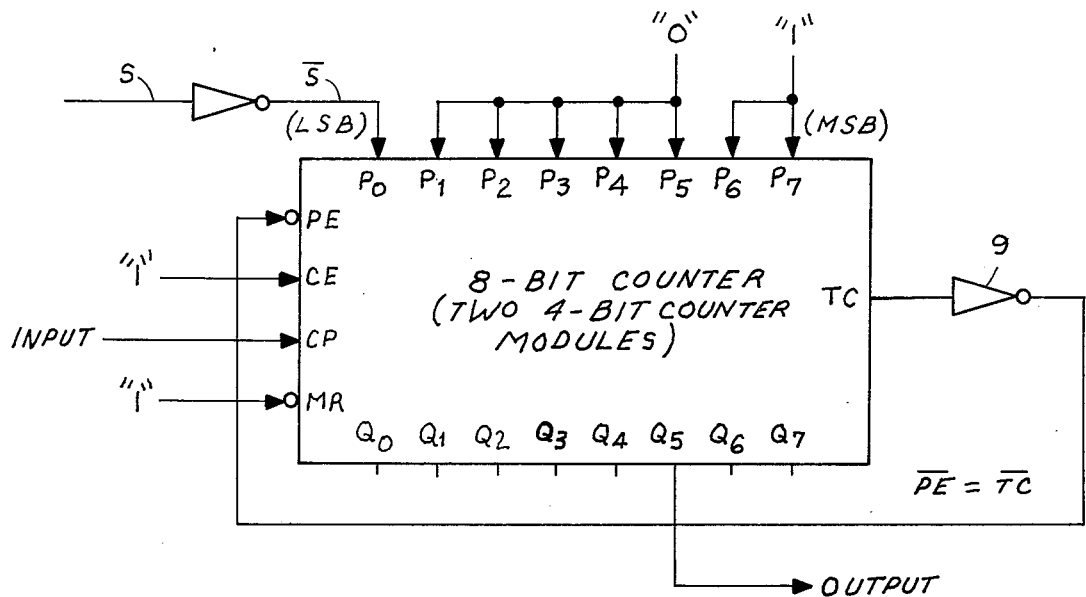
FIG. 4 is a block diagram of the divide by 63 or 64 counter of FIG. 3.
Figure 5:
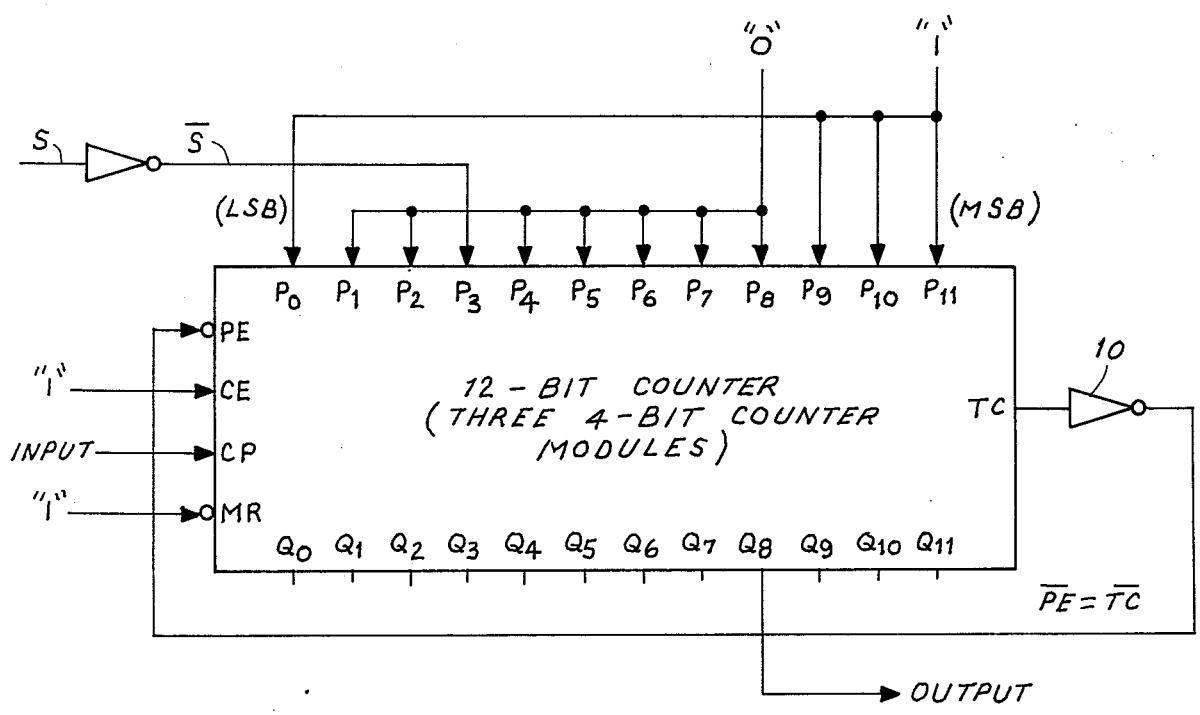
FIG. 5 is a block diagram of the divide by 503 or 511 counter of FIG. 3.

FIGS. 4 and 5 illustrate how the Fairchild model 9316 is employed to provide counter 5 and counter 6, respectively. The counter of FIGS. 4 and 5 count in binary code, advancing the count for each rising edge of the clock input CP, provided that the count enable CE is high (logic 1 enabled). The parallel enable $\overline{PE}$ is high (logic 1, disabled) and the master reset $\overline{MR}$ is high (logic 1, disabled). CE low will disable counting. $\overline{PE}$ low enables a new count represented by the states of inputs $P_0, P_1 \ldots P_{N-1}$ to be loaded into the counter on the next rising edge of the clock input CP, regardless of the state of the CE. $\overline{MR}$ low resets the counter to the count of zero, regardless of the condition of $\overline{PE}$ and CE. The least significant bit (LSB) is numbered 0, the most significant bit (MSB) is numbered N−1. In all there are N bits. The terminal count TC output is 1 if and only if the count is all 1'3, the binary representation of $2^N−1$.

The counter of FIG. 4 can be made to divide the input frequency by J, that is, to cycle through J states by causing the count $2^N−J$ to be loaded next after the terminal count $2^N−1$ is detected. Then the count sequence will be $2^N−J, 2^N−J + 1, 2^N−J + 2 \ldots 2^N−J \ldots$ Similarly, a divide-by-K mode is obtained by loading $2^N−K$ when TC indicated that the count is $2^N−1$. Since the load control $\overline{PE}$ is enabled low and TC is enabled high, TC is inverted by inverter 9 to provided a $\overline{PE}$ control. CE and $\overline{MR}$ are not needed for this application, and therefore are connected to logic 1 voltage to enable counting and disable resetting always. The counter of FIG. 4, which may be employed for counter 5 of FIG. 1, will divide by a ratio 63 for a slip rate input S = 0 and divide by a ratio 64 for a slip rate input S = 1.

FIG. 5 shows a counter with a divide ratio of 503 for S = 0, and a divide ratio 511 for S = 1. The counter of FIG. 5 also includes an inverter 10 for the same reasons mentioned hereinabove with respect to FIG. 4.

The following will show how the parallel data inputs to the counter are chosen to provide the above-mentioned divide ratios.

For J = 63 and K = 64 counter, a counter with N = 6 bits is sufficiently large because $2^N \geq 64 > 63$. However, using 4-bit counter modules, N has been chosen to equal 8 and $2^N = 256$. Next, 2–J and $2^N$–K are computed to be 193 and 192, respectively. One of these numbers must be loaded into the counter when it reaches the terminal count $2^N-1 = 255$, depending on S as follows:

| Decimal | Binary | S | $\bar{S}$ |
|---------|--------|---|---|
| 193 | 11000001 | 0 | 1 |
| 192 | 11000000 | 1 | 0 |

MSB ↑         ↑ LSB

The LSB of each number, written in binary, is seen to be the same as S, the logical inverse of S and the remaining bits happen to be constant 1's and 0's regardless of S. The counter inputs are connected accordingly in FIG. 4. Notice that the extra unused bits $P_6$ and $P_7$ are loaded with 1's and remain 1's always, because the counter counts upward to 255 (all 1's) before being loaded again. The most significant of the used bits, bit 5, ($Q_5$) is taken as the counter output and changes from 1 to 0 only when the counter is loaded, once for each 63 or 64 input clock pulses.

FIG. 5 is the implementation of counter 6 where L = 503 and M = 511. N = 9 is sufficient ($2^N = 512$), but the next larger factor of 4, N = 12 is chosen instead. ($2^{12} = 4096$.) As before, $2^N$–L and $2^N$–M are computed to be 3593 and 3585, respectively. These numbers are converted to binary form and compared with S and $\bar{S}$ as follows:

| Decimal | Binary | S | $\bar{S}$ |
|---------|--------|---|---|
| 3593 | 111000001001 | 0 | 1 |
| 3585 | 111000000001 | 1 | 0 |

↑ bit 3

In this case it happens that bit 3 is identical to $\bar{S}$, and the other bits are constant 1 and 0. The data inputs of the counter are connected accordingly. In general, an input bit will be equal to either S, $\bar{S}$, 0 or 1. Since N = 9 is the minimum number of bits needed, bit 8 ($Q_8$) (the ninth bit) is taken as the output.

The timing of each counter is as shown in FIG. 6. In the double differential PLL of FIG. 3, phase comparator 7 compares the falling edges of the counter outputs, the controlling action of that loop tending to align those edges. Therefore, the TC of the counters will tend to be aligned. The counters respond to the slip rate signal only when loading, during TC = 1. By triggering the slip logic (digital loop filter 12 and digitally controlled rate generator 13) with rising edge of the output of generator 2, both counters will respond to the same state of S, thus either both slipping or neither slipping. "Slipping" is considered to be counting to the larger divide ratio as shown in FIG. 7.

The implementation of phase comparator 11 will now be discussed. Phase comparator 11 compares clock and data for relative phase and produces a digital output. The desired phase position is illustrated in FIG. 8. Assuming that the rising edge of the clock is used to sample the date, this phase position provides the most margin against jitter (timing variation) of clock or data.

A minimal phase comparator is simply a D-type flip flop 15 as illustrated in FIG. 9. Here, the rising edge (transition of the data samples the clock signal (the reverse of the above-mentioned situation). When the data leads the clock, the data slides to the left in FIG. 8, a 1 is sampled. When the data lags the clock, a 0 is sampled. Thus, a 1 output may be taken to indicate positive (lead) phase error, and a 0 to indicate negative (lag) phase error.

This provides a rather crude estimate of the phase error since it indicates only the sign, but not the magnitude, of the phase error. However, if the clock is generated by a counter or any other means that provides multiple phases, the basic principle of the phase comparator of FIG. 9 can be extended to gain greater precision.

For example, suppose that both clock and delayed clock signals are available as shown in Curves A and B of FIG. 11. Here, if another D-type flip flop 16 is added to flip flop 15 of FIG. 9 as shown in FIG. 10 and used to sample the clock-delayed signal produced by delay circuit 17 on a data edge, a 1 is sampled for small phase errors and 0 for large phase errors. In general, if these is a set of clock signals whose edges divide the clock period into several subintervals, and whose states uniquely identify each such subinterval, then sampling all of the clock signals by the data edge will identify the subinterval of the clock period in which the data edge occurs, and thereby indicates the relative phase of clock and data. The code generated by the sampling flip flops 15 and 16 may be interpreted as a numerical estimate of phase error.

The PLL will acquire lock much more quickly when phase comparator 11 of the PLL responds also to frequency error (in an out-of-lock condition). Methods of achieving this are known for a phase comparator that compares two clock signals. In this instance, however, it is desired to achieve this affect for a phase comparator that compares a clock signal with an NRZ (non-return-to-zero) binary data signal.

This can be done by sampling the clock and the clock delayed ¼-bit period with one edge of the data signal, for example, the rising edges, and processing these samples with the sequential logic to be described hereinbelow. This is similar to the phase comparator of FIG. 10. The 2-bit code formed by these samples, as indicated in FIG. 11, indicates whether the phase error is positive (+) or negative (−) and whether large (LG) or small (SM).

As the data edge moves relative to the clock, it samples different 2-bit codes: 10, 11, 01, and 00, also designated +LG, +SM, −SM, and −LG as shown in FIG. 11. The phase comparator sequential logic also has two-bit states also named +LG, +SM, −SM, and −LG, to suggest a relation to the phase samples. The next state is a function of the previous state and the present sample, as illustrated in TABLE I.

TABLE I

| PREVIOUS STATE | PRESENT SAMPLE | NEXT STATE |
|---|---|---|
| +LG | +LG | +LG |
| +LG | +SM | +SM |
| +LG | −SM | +LG |
| +LG | −LG | +LG |
| +SM | +LG | +LG |

TABLE I-continued

| PREVIOUS STATE | PRESENT SAMPLE | NEXT STATE |
|---|---|---|
| +SM | +SM | +SM |
| +SM | −SM | −SM |
| +SM | −LG | −SM |
| −SM | +LG | +SM |
| −SM | +SM | +SM |
| −SM | −SM | −SM |
| −SM | −LG | −LG |
| −LG | +LG | −LG |
| −LG | +SM | −LG |
| −LG | −SM | −SM |
| −LG | −LG | −LG |

The rules given in TABLE I above are also expressed pictorially in FIG. 12. The four circles represent the states, the arrows represent changes of state, and the labels on the arrows represent the phase sample which is the condition for making that change of state. The position of the states in FIG. 12 are arranged to suggest the cyclic sequence of the corresponding phases shown in FIG. 13, wherein zero phase error is between +SM and −SM. Clockwise changes of phase represents negative frequency error, and counter-clockwise changes of the phase represents positive frequency error. By inspection of TABLE I and FIG. 12, it can be seen that in most cases, the next state is the same as the present sample. Exceptions are marked *or++in TABLE I. The exceptions marked with *cause the state to become (+) whenever the frequency error is (+) (phase rotating counter-clockwise) and to remain (+) as long as the frequency error remains (+). The state can return to (−) only when the phase crosses the zero point in a clockwise direction. A similar but opposite relation holds for negative frequency error.

Only when the phase is very erratic (noisy) from poor received signal conditions will the sampled phase change to a non-adjacent phase position, such as from +SM to −LG. The exceptions marked ++in TABLE I provide for a minimal change through zero in such cases.

The phase/frequency comparator output will indicate whether the state is (+) or (−). When there is a frequency error (PLL out-of-lock), the output will indicate the direction of the frequency error. When there is a zero frequency error, (PLL in-lock), the phase will normally dither between +SM and −SM, and the output will indicate the direction of the phase error.

Without the frequency detection capability, both (+) and (−) phase error is detected when out-of-lock. The loop is corrected in the proper direction (thus pulled into lock) only because the (+) phase error is detected slightly more often than the (−) phase error when the frequency error is (+). A similar but opposite condition is present when the frequency error is (−). The corrective force (rate of pull-in) is thus much weaker than a steady indication of (+) or (−), as provided in the phase/frequency comparator discussed herein.

Figure 14:
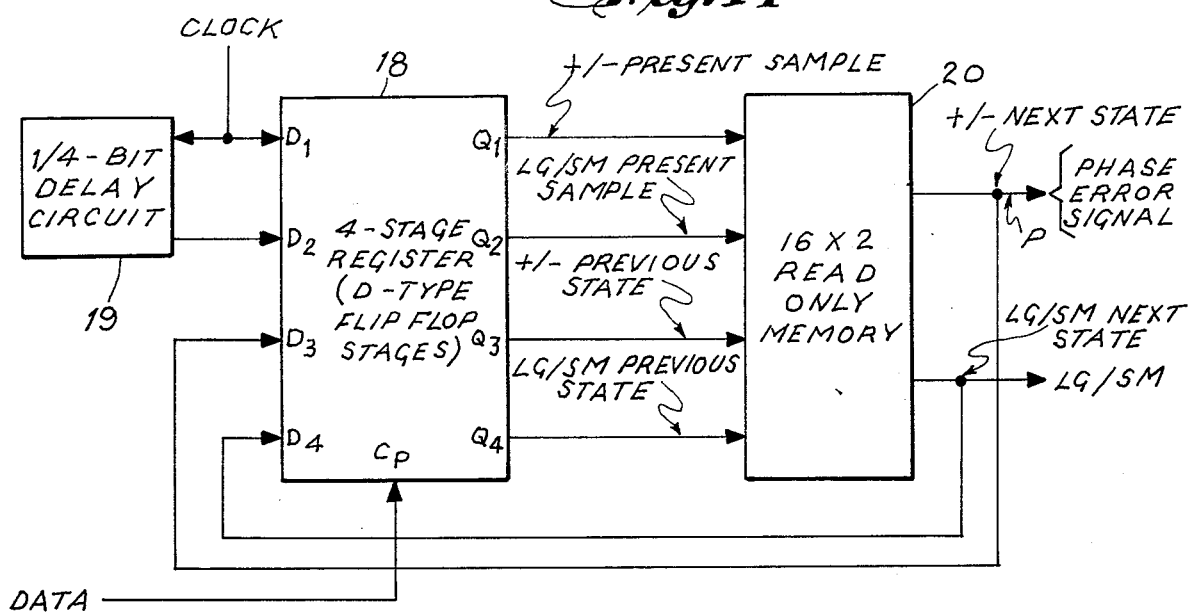
FIG. 14 is a phase/frequency comparator that may be employed as the phase comparator of FIG. 3 coupled to the data input.

The implementation of the phase/frequency comparator is illustrated in FIG. 14. As illustrated, the data is connected to the clock input CP of a four stage register 18 and the clock is directly coupled to the first D-type flip flop stage of register 18 and through a ¼-bit delay circuit 19 to the second D-type flip flop stage of register 18. The operation of the first and second stages is similar to the phase comparator of FIG. 10 and provides at the output $Q_1$ a signal representing the +/−present sample of the data and at the output $Q_2$ a signal representing the LG/SM present sample of the data. These signals coded as illustrated in FIG. 11 are coupled to a 16 × 2 read only memory 20. Read only memory 20 also receives from the third and fourth D-type flip flop stages of register 18 a signal representing the +/−previous state of the data and a signal representing the LG/SM previous state of the data which are derived by coupling the output of read only memory 20 to the input of the third and fourth stages of register 18. The phase error signal output P represents the +/−next state as indicated in TABLE I. The read only memory 20 is wired or coded according to TABLE I to provide the desired output.

Register 18 may be a Fairchild model 54S175 integrated circuit, while the read only memory 20 may be constructed from two 8-to-1 multiplexers, such as Fairchild model 54S151 integrated circuit.

TABLE II

| PREVIOUS STATE | PRESENT SAMPLE | NEXT STATE |
|---|---|---|
| +LG | +LG | +SM |
| +LG | +SM | +LG |
| +LG | −SM | +LG |
| +LG | −LG | +LG |
| +SM | +LG | +SM |
| +SM | +SM | +SM |
| +SM | −SM | −SM |
| +SM | −LG | +LG |
| −SM | +LG | −LG |
| −SM | +SM | +SM |
| −SM | −SM | −SM |
| −SM | −LG | −SM |
| −LG | +LG | −LG |
| −LG | +SM | −LG |
| −LG | −SM | −LG |
| −LG | −LG | −SM |

TABLE II illustrates a second set of rules for the phase/frequency detector of FIG. 14 wherein the phases are the same as illustrated in FIG. 13, while the states are illustrated in FIG. 15.

FIG. 16 shows the state transition diagram of TABLE II with the circles, arrows and labels applied to the arrows having the same meaning as mentioned hereinabove with respect to FIG. 12. The only difference in the operation of FIG. 14 for TABLE II is that the read only memory 20 is coded or wired according to TABLE II rather than TABLE I.

Figure 17:
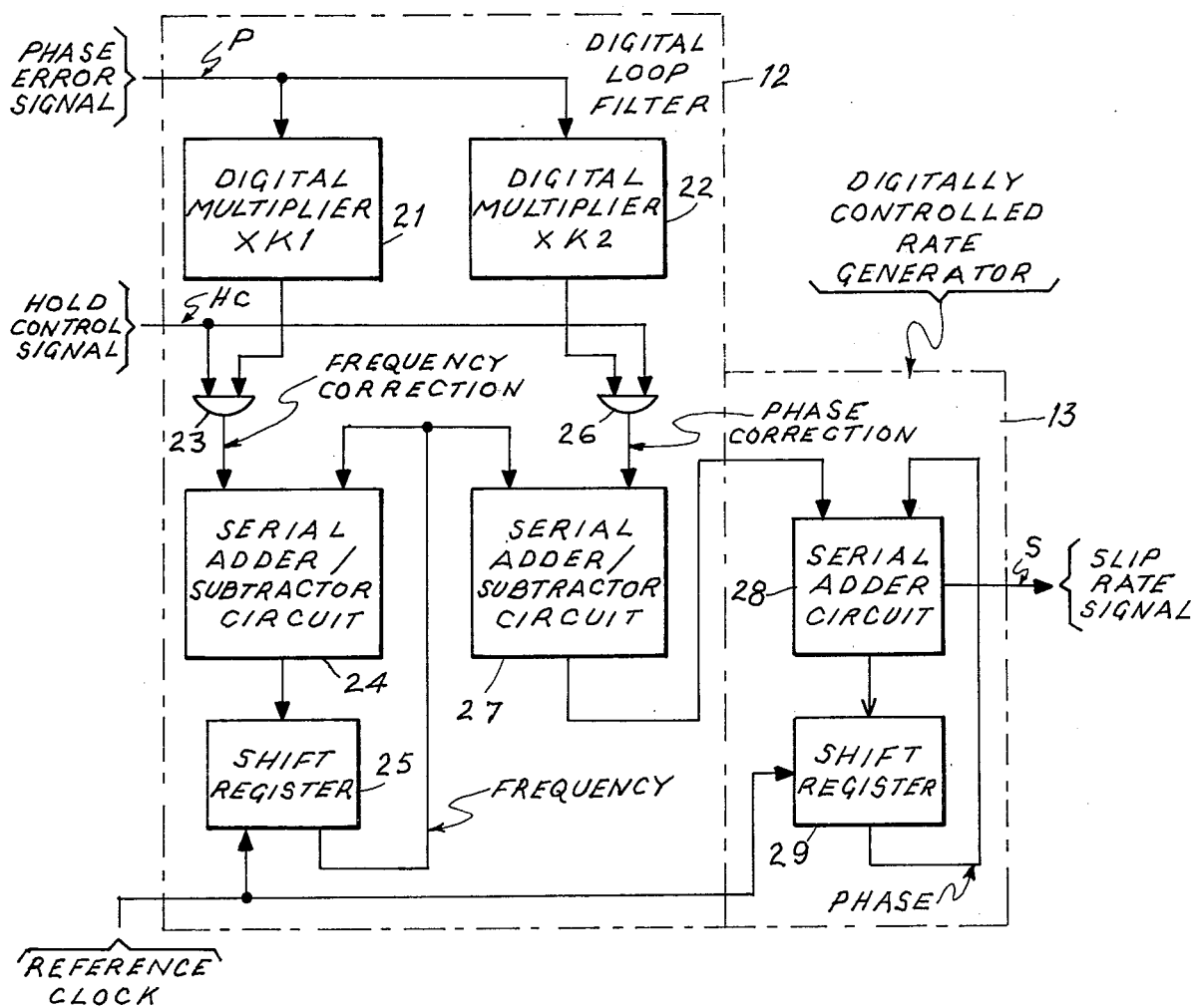
FIG. 17 is a block diagram of the digital loop filter and digitally controlled rate generator of FIG. 3 in accordance with the principles of the present invention.

Referring to FIG. 17 there is disclosed therein a general block diagram of digital loop filter 12 and digitally controlled oscillator 13 of FIG. 3. The phase error signal P is applied to two digital multipliers 21 and 22, each having a different constant K1 and K2 referred to herein as correction factors. These constants assist in speeding up the operation of the PLL to achieve phase lock. The output of multiplier 21 is coupled to AND gate 23 and with the hold control signal HC as produced by detector 14 of FIG. 3 in the 1 condition, a frequency correction signal is coupled through AND gate 23 to serial adder/subtractor circuit 24 and, hence, to shift register 25 under control of a reference clock. The output of shift register 25 is a frequency signal. The output of multiplier 22 is coupled to AND gate 26 and with the hold control signal HC in a 1 condition, a phase correction signal is coupled to serial adder/subtractor circuit 27. The output of circuit 27 is coupled to serial adder circuit 28 and, added to the phase signal output of register 29 to provide an input signal to the input of shift register 29. Register 29 is also under control of the reference clock. The phase slip rate signal S is produced by circuit 28.

Circuits 24, 25 and 28 add the inputs shown while registers 25 and 29 store the outputs of circuits 24 and 28, respectively, when clocked by the reference clock. The output of each of registers 25 and 29 is the coded value stored in the register.

The value stored in register 25 represents a frequency. Each time register 25 is clocked, a frequency correction value, at the output of AND gate 23, proportional to the phase error (which may be positive or negative) is added to the present frequency (output of register 25), and the sum (corrected frequency) is stored in register 25. The frequency corrections from gate 23, thus cumulatively correct the frequency stored in register 25. Circuit 27 sums the corrected frequency from register 25 and a non-cumulative correction from gate 26, to form the coded frequency output of the digital loop filter 12. This frequency code controls the frequency of the output of the digitally-controlled rate generator 13.

The values stored in register 29 represent the phase of generator 13. The phase should advance at a rate proportional to the output frequency of generator 13. Therefore, for each period of the reference clock, the phase should increase an amount proportional to the output frequency. Circuit 28 adds this phase increase (output of generator 13) to the present phase (the output of register 29) and the sum (the next phase) is stored in register 29 when register 29 is clocked. More precisely, however, register 29 stores only the fractional part of the phase (that is, a fraction of one cycle). The phase increase is also a fraction, and sometimes the sum at the output of circuit 28 will be greater than one cycle. In these cases only the fractional part of a cycle is stored in register 29, and a carry out of circuit 28 representing the whole cycle is used to generate a pulse. Since these pulses represent whole cycles, the pulse rate is the desired output frequency (slip rate signal S).

Since the correction from gate 26 accumulates a phase correction (although not accumulating a frequency correction), it will generally be called a phase correction even though it also momentarily acts as a frequency correction.

One way of implementing the functions shown in FIG. 17 is to use parallel adders and parallel-in, parallel-out registers. In the case that phase error is represented by a single bit P indicating positive error (negative correction) or negative error (positive correction), and two's-complement binary arithmetic is used, the output of each multiplier 21 and 22 is either the constant K with 0 carry into the adder for P = 0 (positive correction) or the complement of K with the carry-in equal to 1 for P = 1 (negative correction). However, serial arithmetic, although using more clocked steps for each addition, requires less adding circuitry and less connections.

As illustrated in FIG. 18, serial adder 28 includes a full adder 30 and a carry flip flop 31 of the D-type. The serial adder can add two N-bit binary numbers in N clock periods, with one clock pulse for each bit position. The output of flip flop 31 provides the carry signal under all conditions and is applied as an input to adder 30 for addition of the next bit position.

The serial adder/subtractor circuits 24 and 27 each include a full adder 32 and a carry flipflip 33 of the D-type. In addition, each of the circuits 24 and 27 include an EXCLUSIVE-OR GATE 34 to invert the input to adder 32 when the subtract mode is selected where the input to adder 32 from gate 34 is subtracted from the input from shift register 25. The add mode operates as discussed with respect to circuit 28.

For either citcuit 28 or circuits 24 and 27, when there is an arithmetic overflow or carry out of the MSB position, this appears at the D input of the carry flip flop during the MSB clock period (last bit of a addition), and at the Q output of the carry flip flop during the next clock period (LSB of the next addition).

Counter 5 together with the clock from generator 2 control NAND gate 35 to produce the reference clock signal for the carry flip flops 31, 33 and 33' and the shift registers 25 and 29. D-type flip flops 36 and 37 when connected to the generator 2 and to the Q5 output of counter 5 and to the Q output of flip flop 31 produces the slip rate signal S. FIG. 19 illustrates the operation of circuits of FIG. 18.

In the case that the phase error is represented by only one bit (arithmetic sign) and an existing counter such as counter 5 can be used to control the counting of the serial arithmetic, the logic required for the K1 and K2 multiplications practically disappears, reducing the circuit costs. One reason for this is that the sign of the phase error coupled through D-type flip flop 38 under control of the output of Q5 of counter 5 simply controls the add/subtract mode; there is no phase error amplitude information.

The correction factor K2 is coupled to gate 34' and the factor K1 and an additional K3 to further speed up the lock of PLL when the PLL is far out-of-lock is coupled through multiplexer 39 under control of the LG/SM output of memory 20 of FIG. 14 with the output of multiplexer 39 being coupled to gate 34.

AND gates 40, 41 and 42 when connected to the outputs of counter 5 as illustrated, provide the correction factors K1, K2 and K3 whose values are determined as illustrated in the timing diagram of FIG. 20. It should be noted that while these correcting factors are relatively large integers, the pulses generated are only small fractions of a count cycle.

While I have described above the principles of my invention in connection with specific apparatus it is to be clearly understood that this description is made only by way of example and not as a limitation to the scope of my invention as set forth in the objects thereof and in the accompanying claims.

I claim:

1. A digital double differential phase-locked loop for extraction of a bit clock from digital data comprising:
   a source of digital data;
   first means to provide a reference pulse train having a predetermined reference frequency;
   second means including a voltage controlled oscillator to provide said bit clock having a repetition frequency locked to said repetition frequency of the bits of said digital data;
   third means coupled to said first means to divide said reference frequency by a selected one of a first division factor and a second division factor different than said first division factor;
   fourth means coupled to said second means to divide said repetition frequency by a selected one of a third division factor and a fourth division factor different than said first, second and third division factors;
   fifth means coupled to said third and fourth means to compare the phase of the output signals of said third and fourth means and to produce a first control signal proportional to the phase difference between the output signals of said third and fourth means;

sixth means coupled to said fifth means and said second means to couple said first control signal to said voltage controlled oscillator to adjust the phase of said bit clock to lock said bit clock to the bits of said digital data; and seventh means coupled to said source, said second means and said third and fourth means to produce a phase slip rate signal to select the appropriate one of said first and second division factors for said third mans and to select the appropriate one of said third and fourth division factors for said fourth means.

2. A phase-locked loop according to claim 1, wherein
said first division factor is J,
said second division factor is K,
said third division factor is L, and
said fourth division factor is M, where J, K, L and M are integers greater than one and satisfy the equation JM−KL =1.

3. A phase-locked loop according to claim 2, wherein
said third means includes
a first digital counter having a division factor selected from the values J and K, and
said fourth means includes
a second digital counter having a division factor selected from the values of L and M.

4. A phase-locked loop according to claim 3, wherein
said first counter has a division factor of J and said second counter has a division factor of L during the absence of said phase slip rate signal, and
said first counter has a division factor of K and said second counter has a division factor of M during the presence of said phase slip rate signal.

5. A phase-locked loop according to claim 4, wherein
said fifth means includes
a first digital phase comparator.

6. A phase-locked loop according to claim 5, wherein
said sixth means includes
a low pass filter.

7. A phase-locked loop according to claim 6, wherein
said seventh means includes
a second digital phase comparator coupled to said second means and said source responsive to said data and said bit clock to produce a second control signal proportional to the phase difference between said bit clock and said data,
a digital filter coupled to said first means and said second phase comparator responsive to said second control signal to provide a frequency value proportional to said second control signal, and
a digitally controlled rate generator coupled to said first means and said digital loop filter responsive to said frequency value to produce said phase slip rate signal.

8. A phase-locked loop according to claim 7, further including
eighth means coupled to said source and said digital loop filter to cause said digital loop filter to hold said frequency value provide by the last detected bit of said data when loss of said data for a predetermined length of time is detected.

9. A phase-locked loop according to claim 7, wherein
said second phase comparator includes
a D-type filp flop having its D input coupled to said second means responsive to said bit clock, its clock input coupled to said source responsible to the bits of said data and its Q output to provide said second control signal.

10. A phase-locked loop according to claim 7, wherein
said second phase comparator includes
a first D-type flip flop having its D input coupled to said second means responsive to said bit clock, its clock input coupled to said source responsive to the bits of said data and its Q output to provide one bit of two bits of said second control signal,
a delay circuit having a ¼-bit delay coupled to said second means to delay said bit clock ¼ of a bit, and
a second D-type flip flop having its D input coupled to the output of said delay circuit responsive to said delayed bit clock, its clock input coupled to said source responsive to the bits of said data and its Q output to provide the other bit of said two bits of said second control signal.

11. A phase-locked loop according to claim 7, wherein
said second phase comparator includes
a delay circuit having a ¼-bit delay coupled to said second means to delay said bit clock ¼-bit,
a four stage register having a clock input coupled to said source responsive to the bits of said data, a first input coupled to said second means responsive to said bit clock, a second input coupled to said delay circuit responsive to said delayed bit clock, a first output providing a plus/minus phase error signal of a present sample of said data, a second output providing a large/small phase error signal of said present sample of said data, a third output providing a plus/minus phase error signal of a previous state of said data and a fourth output providing a large/small phase error signal of said previous state of said data, and
a 16×2 read only memory having two outputs coupled to said first, second, third and fourth outputs of said register, said memory being wired according to a given set of rules to provide on one output thereof a plus/minus phase error signal for a next state of said data and on the other output thereof a large/small phase error signal for said next state of said data, said one output being coupled to a third input of said register to provide said signal on said third output and said other output being coupled to a fourth input of said register to provide said signal on said fourth output,
said delay circuit, said register and said memory cooperating to provide negative frequency errors for clockwise changes of phase states of said data and positive frequency errors for counter-clockwise changes of phase states of said data in accordance with said set of rules.

12. A phase-locked loop according to claim 1, wherein
said second phase comparator further includes
a D-type flip flop having its D input coupled to said one output of said memory and its clock input coupled to said third means responsive to transitions from most significant bits to least significant bits to produce said second control signal.

13. A phase-locked loop according to claim 7, wherein
said digital loop filter includes a first serial adder/subtractor circuit having one input coupled to said second phase comparator responsive to said second control signal and a first correction factor, said second control signal and said first correction factor representing a frequency correction, a first shift register coupled to the output of said first circuit and said first means to provide a frequency signal for coupling to the other input of said first circuit, and a second serial adder/subtractor circuit having one input coupled to the output of said first shift register and its other input coupled to said second phase comparator responsive to said second control signal and a second correction factor, said second control signal and said second correction factor representing a phase correction.

14. A phase-locked loop according to claim 13, wherein said rate generator includes
a serial adder circuit having one input coupled to the output of said second circuit, and
a second shift register coupled to said first means, the output of said serial adder circuit and the other input of said serial adder circuit,
said serial adder circuit producing said phase slip rate signal.

15. A phase-locked loop according to claim 13, further including
a data detector coupled to said source to detect the presence and absence of said data, and
logic circuitry coupled to said data detector and between said second phase comparator and each of said first and second circuits to hold said frequency value provided by the last detected bit of said data during absence of said data for a predetermined length of time.

16. A phase-locked loop according to claim 7, wherein said rate generator includes
a serial adder circuit having one input coupled to the output of said digital loop filter, and
a shift register coupled to said first means, the output of said serial adder circuit and the other input of serial adder circuit,
said serial adder circuit producing said phase slip rate signal.

17. A phase-locked loop according to claim 1, wherein
said fifth means includes
a digital phase comparator.

18. A phase-locked loop according to claim 1, wherein
said sixth means includes
a low pass filter.

19. A phase-locked loop according to claim 1, wherein
said seventh means includes
a digital phase comparator coupled to said second means and said source responsive to said data and said bit clock to produce a second control signal proportional to the phase difference between said bit clock and said data,
a digital loop filter coupled to said first means and said second phase comparator responsive to said second control signal to provide a frequency value proportional to said second control signal, and
a digitally controlled rate generator coupled to said first means and said digital loop filter responsive to said frequency value to produce said phase slip rate signal.

20. A phase-locked loop according to claim 19, wherein
eighth means coupled to said source and said digital loop filter to cause said digital loop filter to hold said frequency value provided by the last detected bit of said data when loss of said data for a predetermined length of time is detected.

21. A phase-locked loop according to claim 19, wherein
said phase comparator includes
a D-type flip flop having its D input coupled to said second means responsive to said bit clock, its clock input coupled to said source responsive to the bits of said data and its Q output to provide said second control signal.

22. A phase-locked loop according to claim 19, wherein
said phase comparator includes
a first D-type flip flop having its D input coupled to said second means responsive to said bit clock, its clock input coupled to said source responsive to the bits of said data and its Q output to provide one bit of two bits of said second control signal,
a delay circuit having a ¼-bit delay coupled to said second means to delay said bit clock ¼ of a bit, and
a second D-type flip flop having its D input coupled to the output of said delay circuit responsive to said delayed bit clock, its clock input coupled to said source responsive to the bits of said data and its Q output to provide the other bit of said two bits of said second control signal.

23. A phase-locked loop according to claim 19, wherein
said phase comparator includes
a delay circuit having a ¼-bit delay coupled to said second means to delay said bit clock ¼-bit,
a four stage register having a clock input coupled to said source responsive to the bits of said data, a first input coupled to said second means responsive to said bit clock, a second input coupled to said delay circuit responsive to said delayed bit clock, a first output providing a plus/minus phase error signal of a present sample of said data, a second output providing a large/small phase error signal of said present sample of said data, a third output providing a plus/minus phase error signal of a previous state of said data annd a fourth output providing a large/small phase error signal of said previous state of said data, and
a 16×2 read only memory having two outputs coupled to said first, second, third and fourth outputs of said register, said memory being wired according to a given set of rules to provide on one output thereof a plus/minus phase error signal for a next state of said data and on the other output thereof a large/small phase error signal for said next state of said data, said one output being coupled to a third input of said register to provide said signal on said third output and said other output being coupled to a fourth input of said register to provide said signal on said fourth output, said delay circuit, said register and said memory cooperating to provide negative frequency errors for clockwise changes of phase states of said data and positive frequency errors for counter-clockwise changes of phase states of said data in accordance with said set of rules.

24. A phase-locked loop according to claim 23, wherein
said phase comparator further includes
a D-type flip flop having its D input coupled to said one output of said memory and its clock input coupled to said third means responsive to transitions from most significant bits to least significant bits to produce said second control signal.

25. A phase-locked loop according to claim 19, wherein
said digital loop filter includes
a first serial adder/subtractor circuit having one input coupled to said phase comparator responsive to said second control signal and a first correction factor, said second control signal and said first correction factor representing a frequency correction,
a first shift register coupled to the output of said first circuit and said first means to provide a frequency signal for coupling to the other input of said first circuit, and
a second serial adder/subtractor circuit having one input coupled to the output of said first shift register and its other input coupled to said phase comparator responsive to said second control signal and a second correction factor, said second control signal and said second correction factor representing a phase correction.

26. A phase-locked loop according to claim 25, wherein
said rate generator includes
a serial adder circuit having one input coupled to the output of said second circuit, and
a second shift register coupled to said first means, the output of said serial adder circuit and the other input of said serial adder circuit,
said serial adder circuit producing said phase slip rate signal.

27. A phase-locked loop according to claim 25, further including
a data detector coupled to said source to detect the presence and absence of said data, and
logic circuitry coupled to said data detector and between said phase comparator and each of said first and second circuits to hold said frequency value provided by the last detected bit of said data during absence of said data for a predetermined length of time.

28. A phase-locked loop according to claim 19, wherein
said rate generator includes
a serial adder circuit having one input coupled to the output of said digital loop filter, and
a shift register coupled to said first means, the output of said serial adder circuit and the other input of serial adder circuit,
said serial adder circuit producing said phase slip rate signal.

29. A phase-locked loop according to claim 1, wherein
said seventh means includes
a delay circuit having a ¼-bit delay coupled to said second means to delay said bit clock ¼-bit,
a four stage register having a clock input coupled to said source responsive to the bits of said data, a first input coupled to said second means responsive to said bit clock, a second input coupled to said delay circuit responsive to said delayed bit clock, a first output providing a plus/minus phase error signal of a present sample of said data, a second output providing a large/small phase error signal of said present sample of said data, a third output providing a plus/minus phase error signal of a previous state of said data and a fourth output providing a large/small phase error signal of said previous state of said data,
a 16 × 2 read only memory having two outputs coupled to said first, second, third and fourth outputs of said register, said memory being wired according to a given set of rules to provide on one output thereof a plus/minus phase error signal for a next state of said data and on the other output thereof a large/small phase error signal for said next state of said data, said one output being coupled to a third input of said register to provide said signal on said third output and said other output being coupled to a fourth input of said register to provide said signal on said fourth output,
said delay circuit, said register and said memory cooperating to provide negative frequency errors for clockwise changes of phase states of said data and positive frequency errors for counter-clockwise changes of phase states of said data in accordance with said set of rules,
a D-type flip flop having its D input coupled to said one output of said memory and its clock input coupled to said third means responsive to transitions from most significant bits to least significant bits to produce said second control signal
a first serial adder/subtractor circuit having one input coupled to the Q output of said flip flop responsive to said second control signal and a first correction factor, said second control signal and said first correction factor representing a frequency correction,
a first shift register coupled to the output of said first circuit and said first means to provide a frequency signal for coupling to the other input of said first circuit,
a second serial adder/subtractor circuit having one input coupled to the output of said first shift register and the other input coupled to the Q output of said flip flop responsive to said second control signal and a second correction factor, said second control signal and said second factor representing a phase correction,
a serial adder circuit having one input coupled to the output of said second circuit, and
a second shift register coupled to said first means, the output of said serial adder circuit and the other input of said serial adder circuit,
said serial adder circuit producing said phase slip rate signal.

30. A phase-locked loop according to claim 29, further including
a third correction factor,
a multiplexer coupled to said first correction factor, said third correction factor, said other output of said memory and said first circuit, said signal on said other output of said memory controlling said multiplexer to couple one or the other of said first and third correction factor to said first circuit.

* * * * *